United States Patent [19]

Wojnarowski et al.

[11] Patent Number: 5,567,657
[45] Date of Patent: Oct. 22, 1996

[54] FABRICATION AND STRUCTURES OF TWO-SIDED MOLDED CIRCUIT MODULES WITH FLEXIBLE INTERCONNECT LAYERS

[75] Inventors: Robert J. Wojnarowski, Ballston Lake; Thomas B. Gorczyca, Schenectady, both of N.Y.

[73] Assignee: General Electric Company, Schenectady, N.Y.

[21] Appl. No.: 567,386

[22] Filed: Dec. 4, 1995

[51] Int. Cl.⁶ .................................................. H01L 21/60
[52] U.S. Cl. ...................... 437/214; 437/209; 437/217; 437/219; 437/220
[58] Field of Search .................................. 437/209, 211, 437/212, 213, 214, 215, 216, 217, 218, 219, 220

[56] References Cited

U.S. PATENT DOCUMENTS

| | | |
|---|---|---|
| 4,783,695 | 11/1988 | Eichelberger et al. . |
| 4,894,115 | 1/1990 | Eichelberger et al. . |
| 4,918,811 | 4/1990 | Eichelberger et al. .............. 437/209 |
| 4,933,042 | 6/1990 | Eichelberger et al. . |
| 5,055,907 | 4/1992 | Wojnarowski et al. . |
| 5,108,825 | 10/1991 | Jacobs . |
| 5,192,716 | 3/1993 | Jacobs . |
| 5,353,195 | 10/1994 | Fillion et al. . |
| 5,353,498 | 10/1994 | Fillion et al. . |
| 5,452,182 | 9/1995 | Eichelberger et al. . |
| 5,524,339 | 6/1996 | Gorowitz et al. ...................... 437/209 |
| 5,527,741 | 6/1996 | Cole et al. . |

OTHER PUBLICATIONS

U.S. patent application, "Pin Grid Array Integral Package For Multi-Chip Module Interconnections" by C. E. Neugebauer, et al Ser. No. 08/270,532 (RD-21,040) Filed Jul. 5, 1994 Pending.

U.S. patent application, "Encased Integral Molded Plastic Multi-Chip Module Substrate and Fabrication Process" By T. B. Gorczyca, Ser. No. 08/143,519 (RD-22,756) Filed Oct. 29, 1993 Abandoned.

U.S. patent application, "A High Density Interconnected Circuit Module with a Compliant Layer as Part of a Stress-Reducing Molded Substrate", by R. J. Wojnarowski et al, Ser. No. 08/565,269 (RD-MM24214) Filed 11-320-1995. Pending.

Primary Examiner—Charles L. Bowers, Jr.
Assistant Examiner—Kevin M. Picardat
Attorney, Agent, or Firm—Ann M. Agosti; Marvin Snyder

[57] ABSTRACT

First and second flexible interconnect structures are provided and each includes a flexible interconnect layer and a chip with a surface having chip pads attached to the flexible interconnect layer. Molding material is inserted between the flexible interconnect layers for encapsulating the respective chips. Vias in the flexible interconnect layers are formed to extend to selected chip pads, and a pattern of electrical conductors is applied which extends over the flexible interconnect layers and into the vias to couple selected ones of the chip pads.

8 Claims, 6 Drawing Sheets

FABRICATION AND STRUCTURES OF TWO-SIDED MOLDED CIRCUIT MODULES WITH FLEXIBLE INTERCONNECT LAYERS

BACKGROUND OF THE INVENTION

In one form of high density interconnect (HDI) circuit module, an adhesive-coated polymer film overlay having via openings covers a plurality of integrated circuit chips in chip wells on an underlying substrate. The polymer film provides an insulated layer upon which is deposited a metallization pattern for interconnection of individual circuit chips through the vias. Methods for performing a HDI process using overlays are further described in Eichelberger et al., U.S. Pat. No. 4,783,695, issued Nov. 8, 1988, and in Eichelberger et al., U.S. Pat. No. 4,933,042, issued Jun. 12, 1990. Multiple layers of polymer overlays and metallization patterns are typically applied, and significant processing steps are required to complete these multilayer interconnects.

Prefabricated flexible interconnect layers having metallization patterns thereon are manufactured by companies such as Sheldahl Corp., Northfield, Minn., and Parlex Corp., Methuen, Mass., for example. Multichip module and other electronic assembly manufacturers conventionally couple integrated circuit chips and other components to the metallization patterns using mechanical assembly attaching techniques such as wire bonding, tape automated bonding, or solder bumps. A prefabricated flexible interconnect structure typically has at least one insulative film layer having a thickness sufficient to support metallization patterns on each side. The thickness is often between 1 to 5 mils (25 to 125 microns).

Cole et al., "Fabrication and Structures of Circuit Modules with Flexible Interconnect Layers," U.S. application Ser. No. 08/321,346, filed Oct. 11, 1994, now U.S. Pat. No. 5,527,741 describes a method for fabricating a circuit module using a flexible interconnect layer including a metallized base insulative layer and an outer insulative layer. At least one circuit chip having chip pads is attached to the base insulative layer and vias are formed in the outer and base insulative layers to expose selected portions of the base insulative layer metallization and the chip pads. A patterned outer metallization layer is applied over the outer insulative layer extending through selected ones of the vias to interconnect selected ones of the chip pads and selected portions of the base insulative layer metallization.

The technique described in Cole et al. can lower the volume and weight of a circuit module. Because the coefficient of thermal expansion (CTE) of the chips is generally much less that the CTE of the flexible interconnect layer, however, if the area density of chips on the flexible interconnect layer is too high, unbalanced stresses and associated warping can occur.

SUMMARY OF THE INVENTION

It would be desirable to balance module stresses and further increase density while maintaining the low volume and weight of flexible high density interconnect circuit modules and enabling efficient fabrication processes.

Briefly, in accordance with one embodiment of the invention a method for fabricating a circuit module comprises providing first and second flexible interconnect structures with each flexible interconnect structure comprising a flexible interconnect layer and a chip with a surface having chip pads attached to the flexible interconnect layer. Molding material is inserted between the flexible interconnect layers for encapsulating the respective chips. Vias in the flexible interconnect layers are formed to extend to selected chip pads, and a pattern of electrical conductors is applied which extends over the flexible interconnect layers and into the vias to couple selected ones of the chip pads.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, where like numerals represent like components, in which:

DETAILED DESCRIPTION OF A PREFERRED EMBODIMENT OF THE INVENTION

Figure 1:
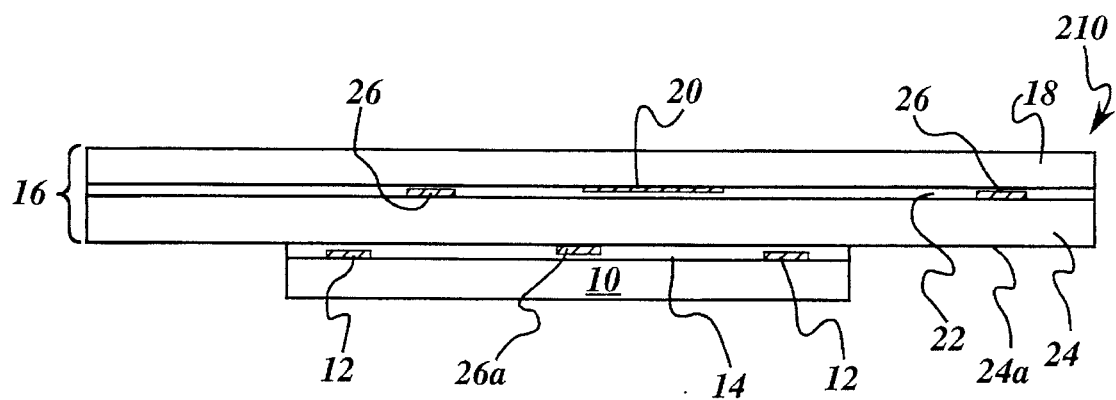
FIG. 1 is a sectional side view of a structure including a chip attached to a flexible interconnect layer.

FIG. 1 is a sectional side view of a structure 210 including a chip 10 having chip pads 12 and attached with an adhesive 14 to a chip surface 24a of a flexible interconnect layer 16. The flexible interconnect layer can be fabricated as described in aforementioned Cole et al. U.S. application Ser. No. 08/321,346, for example, and may comprise one or more polymer layers (shown as layers 18 and 24) which can have optional metallization layers (shown as layers 20, 26, and 26a respectively) on selected surfaces. If multiple polymer layers having prefabricated metallization layers are used, an adhesive layer 22 comprising a material such as SPIE (siloxane-polyimide-epoxy) or ULTEM polyetherimide (ULTEM is a trademark of General Electric Co.), for example, can be applied between the layers during lamination of layers. Lamination using SPIE is described, for example, in Gorczyca et al., U.S. Pat. No. 5,161,093, issued Nov. 3, 1992. Alternatively, if no metallization layer (such as layer 20) is present on an underside of an upper polymer layer, such upper polymer layer can be spin or spray coated over an underlying polymer layer instead of being laminated with an adhesive.

The polymer layers may comprise electrically insulating material upon which an electrically conductive material can adhere such as, for example, KAPTON H polyimide or KAPTON E polyimide (KAPTON is a trademark of E. I. du Pont de Nemours & Co.), APICAL AV polyimide (APICAL is a trademark of Kanegafugi Chemical Industry Company.), UPILEX polyimide (UPILEX is a trademark or UBE Industries, Ltd.), or ULTEM polyetherimide. One or more of the polymer layers can have vias (not shown) which can be metallized simultaneously as metallization layers 20 and 26 are fabricated.

In one embodiment, the metallization layers comprise a metal adhesion-promoting seed material such as titanium or $SnCl_2$, followed by an electrolessly applied layer such as copper which can be coated by a thicker electroplated metal layer such as copper. The metallization layers can be patterned using conventional photoresist patterning techniques, for example. Metallization layers can be present on one or both surfaces of selected polymer layers. If a metallization layer such as layer 26a is on a chip side surface of a polymer layer, it can be situated over a chip but should not be situated over a chip pad to which a via would be drilled.

The circuit chips may comprise integrated circuits or active or passive discrete circuit components such as those available in surface mount technology (SMT), including ultra thin silicon devices available from Kopin Corporation of Connecticut and ultra thin gallium arsenide devices available from Tacan Corporation of California, to form unique conformable multi-chip module (MCM) assemblies. Devices such as an ultrasonic transducer for flexible ultrasound capability or an integrated circuit chip for RADAR applications on curved surfaces of airplane wings, for example, can be useful. Further applications of thin flexible curved surfaces are described in Wojnarowski, U.S. Pat. No. 5,324,687, issued Jun. 28, 1994.

Adhesive 14 may comprise an organic adhesive such as SPIE (siloxane-polyimide-epoxy) or a cyanoacrylate and preferably has sufficient optical absorption properties to allow subsequent laser via drilling to bond pads below. Commercially available hot melt adhesives, die attach adhesives, and/or epoxies may also be used for chip bonding. The adhesive preferably has appropriate dielectric properties to isolate the chip pads and chip surface from mechanical or electrical contact with any metallization layer situated between the chip and flexible interconnect structure 16 (layer 26a as shown in FIG. 1). In one embodiment, a thin insulative layer (not shown) is coated on the polymer layer 24 and metallization layer 26a prior to attaching the chip, and the dielectric properties of the adhesive become less important. Although two polymer layers are shown in FIG. 1, additional layers can be used if desired.

Figure 2:
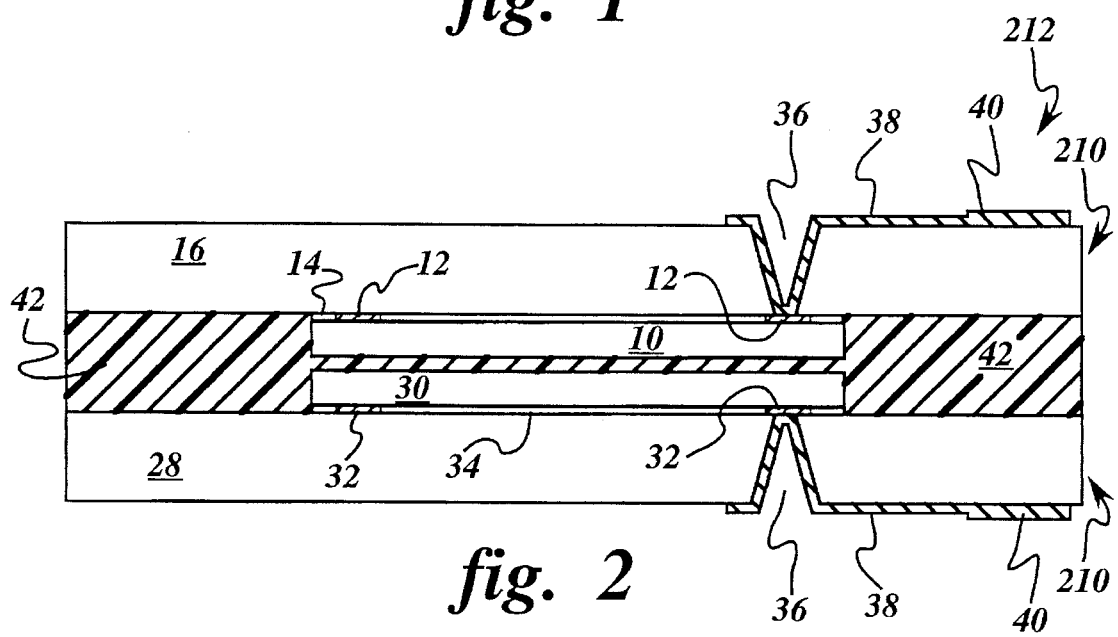
FIG. 2 is a sectional side view of a module including two chip/flexible interconnect layer structures of the type shown in FIG. 1 which are molded together.

FIG. 2 is a sectional side view of a module 212 including two structures 210 of the type shown in FIG. 1 which are molded together. Flexible interconnect layer 28 can be fabricated and attached with an adhesive 34 to chip 30 having chip pads 32 as discussed with respect to FIG. 1. For simplicity, individual polymer and metallization layers of the structures will not be shown in FIG. 2 and the remaining figures.

Figure 2A:
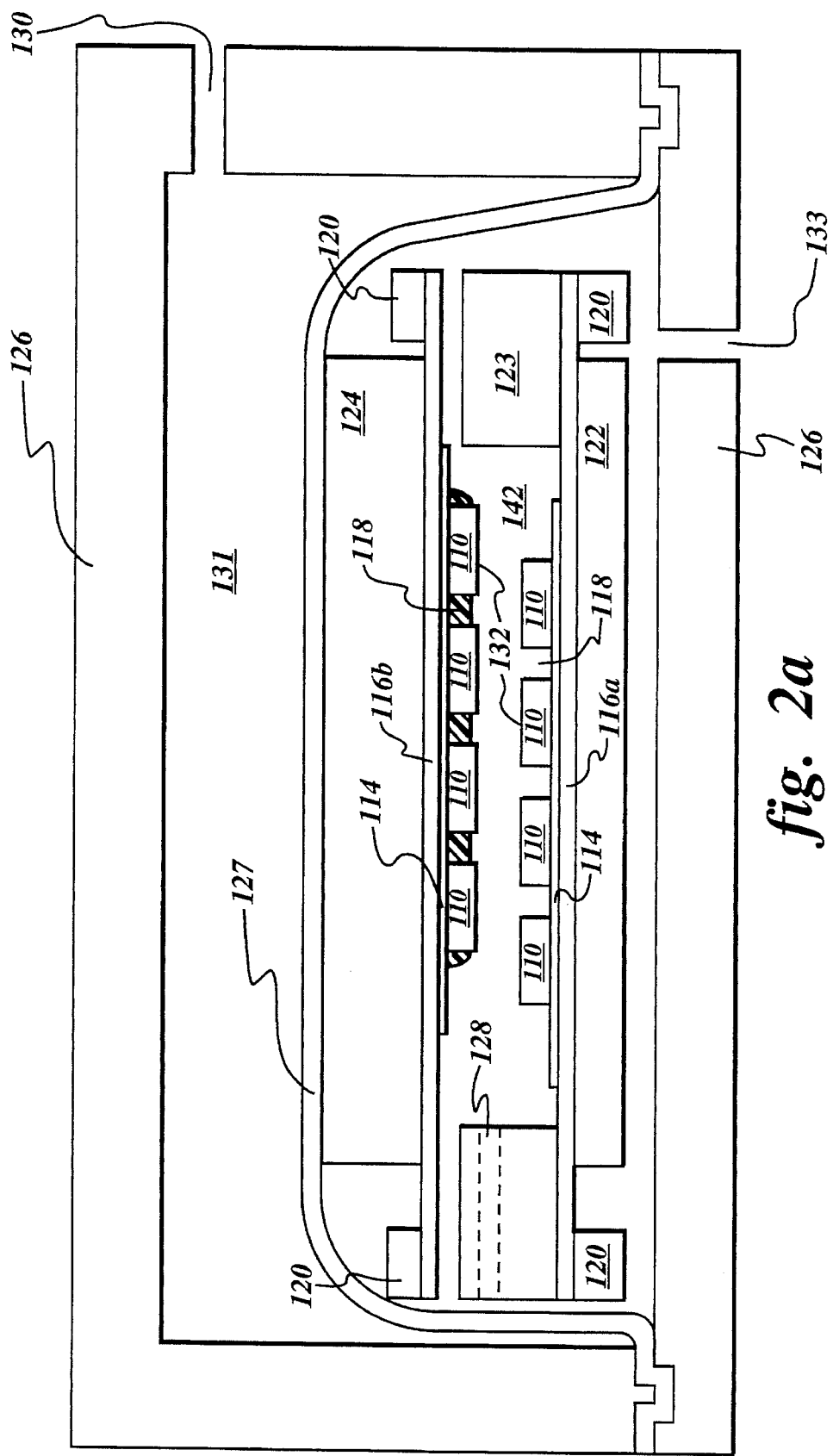
FIG. 2a is a sectional side view illustrating a vacuum chamber fixture for forming the module illustrated in FIG. 2.

FIG. 2a is a sectional side view illustrating a vacuum chamber technique for forming the module illustrated in FIG. 2. For illustrative purposes, FIG. 2a shows a plurality of chips 110 on each flexible interconnect layer 116a and 116b. When a plurality of chips are used on a flexible interconnect layer, it is useful to position optional compliant material 118 between adjacent chips to balance stress on the structure as shown by the compliant material between the chips attached to flexible interconnect layer 116b. The compliant material, if used, can either be present between all chips in both flexible interconnect layers or be situated between selected chips.

The compliant material may comprise a material such as SPIE or RICOCAP F 101-D encapsulant (available from Ricon Electronic Systems, Yorktown Heights, N.Y.), for example, which can withstand further processing steps. Although the compliant material is not necessary for the present invention, it is particularly useful when one of the structures 210 has a higher chip density than the other.

The backsides 132 of the chips in FIG. 2a are not aligned in the way that they are in FIG. 2. Although aligning the backsides of the chips is optional, such alignment further helps to balance stress on the module and leaves more space in the module for placement of vias, through holes, and/or pins, as shown and discussed below.

In one embodiment the molding process occurs in a heated vacuum fixture 126 having a vacuum chamber 131 and a pressurized gas input port 130. The flexible interconnect layers can be held substantially taut by respective rings 120. One of the flexible interconnect layers, shown in FIG. 2a as layer 116a, can be positioned on a base plate 122 of the vacuum chamber. An optional template 123 can then be positioned on the flexible interconnect layer for creating a molding form and serving as a spacer for controlling the height of the mold (if the chips are of an appropriate thickness, the chips themselves can serve as spacers and a mold form is not necessary). A pressure plate 124 can then direct the other flexible interconnect layer 116b chip side down towards the chips of the bottom flexible interconnect layer.

Molding material 142 is preferably supplied in the template region by applying enough molding material over layer 116a before directing layer 116b down towards layer 116a so that when the layers are pressed together there is sufficient molding material between the layers. In an alternative, more complicated embodiment, molding material can be pushed into the space between layers 116a and 116b during processing.

Preferably the molding material is capable of being solidified under appropriate vacuum and temperature conditions. After the material is inserted over layer 116a, pressure plate 124 and layer 116b can be used to squeeze the material under heat and vacuum conditions until the material flows and fills the mold. In one embodiment, air pressure is supplied through port 130 to chamber 131 which includes a diaphragm 127 for preventing an outlet port 133 from releasing the pressure supplied through inlet port 130. The diaphragm may comprises a flexible material such as KAPTON polyimide.

Excess molding material can escape through flow-out ports 128. In one embodiment, the molding material is a granule epoxy powder available from Rohm and Haas Co. of Philadelphia, Pa. under the name Plaskon SMT-B-1, and the molding process occurs at a temperature of 200° C. and pressure of 40 psi (pounds per square inch) for 30 minutes.

Other molding techniques and materials which may be appropriate are discussed in Fillion et al., U.S. Pat. No. 5,353,498, issued Oct. 11, 1994, and in Gorczyca, "Solventless Process for Fabricating Polyimide/Epoxy Plastic Molded Parts," U.S. application Ser. No. 08/265,051, filed Jun. 24, 1994, which is a continuation in part of U.S. application Ser. No. 08/143,519, filed Oct. 29, 1993.

Vias 36, shown in FIG. 2, extending to chip pads and/or metallization layers 20 and 26 (shown in FIG. 1) and outer metallization layers 38 can be formed by any appropriate process. A preferred method of laser-drilling vias in the polymer film is described in Eichelberger et al., U.S. Pat. No. 4,894,115, issued Jan. 16, 1990. For the fabrication of small diameter vias, the total thickness of each flexible interconnect layer should be minimized.

Aforementioned Cole et al., U.S. application Ser. No. 08/321,346, describes a multi-step deep via fabrication technique (not shown in FIG. 2a) wherein a first step is the formation of a wide well having a bottom surface followed by the formation of a more conventional size via at the bottom of the deep well. The two steps can be performed by using two mask processes, by using an excimer laser and adjusting the beam size, or by using a programmable laser with the adaptive lithograph technique.

Outer metallization layers 38 comprise electrically conductive material and can be applied using vacuum deposition, for example, by sequentially sputtering a thin layer of titanium (for adhesion purposes), sputtering a thin layer of copper, and electroplating a thicker layer of copper (typically ranging from three to ten micrometers) before being patterned with photoresist to provide the desired connections. In one embodiment an adaptive lithography system is used to provide electrically conductive interconnections as described in Eichelberger et al., U.S. Pat. No. 4,835,704. Although the formation of vias 36 and outer metallization 38 is shown as occurring after molding, these steps may occur prior to molding if desired and if appropriate protection is provided between the metallization layers and the base and pressure plates. An advantage to forming the vias and metallization patterns after molding is that the surfaces of the flexible interconnect layers are relatively planar.

Figure 3:
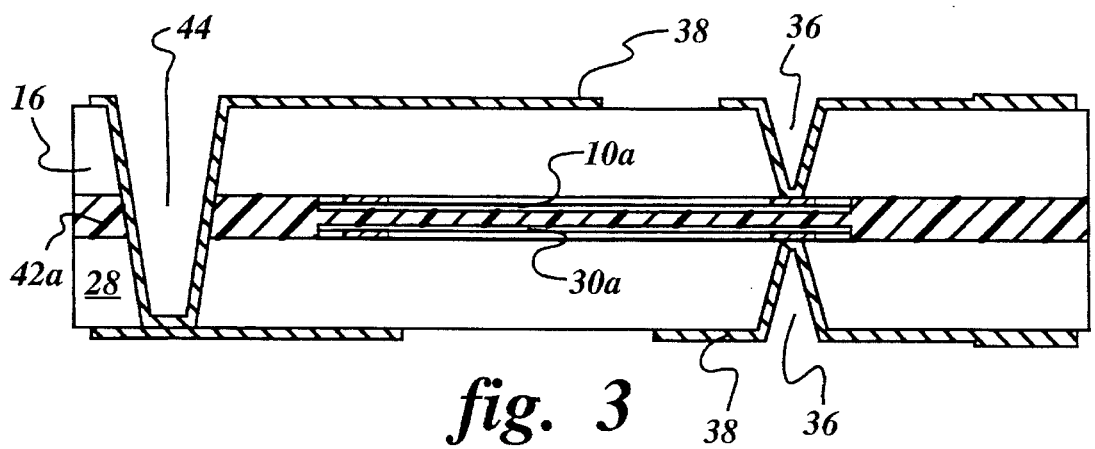
FIG. 3 is a view similar to that of FIG. 2 further showing thin chips and a metallized through via for coupling the flexible interconnect layers.

FIG. 3 is a view similar to that of FIG. 2 further showing thin chips 10a and 30a and a metallized through via 44 for coupling flexible interconnect layers 16 and 28. Via 44 can be fabricated in the manner discussed with respect to vias 36. In this embodiment, outer metallization layers 38 are shown to extend over the flexible interconnect layers and into via 44. In another embodiment, a via can be fabricated to extend to a metallization layer of the type illustrated by metallization layers 20 and 26 in FIG. 1. In one method, one of the outer metallization layers is applied before the other. An advantage of this method is that if via 44 is later formed by laser ablation (drilling), the earlier applied metallization layer can serve as a landing layer during the ablation process.

Figure 4:
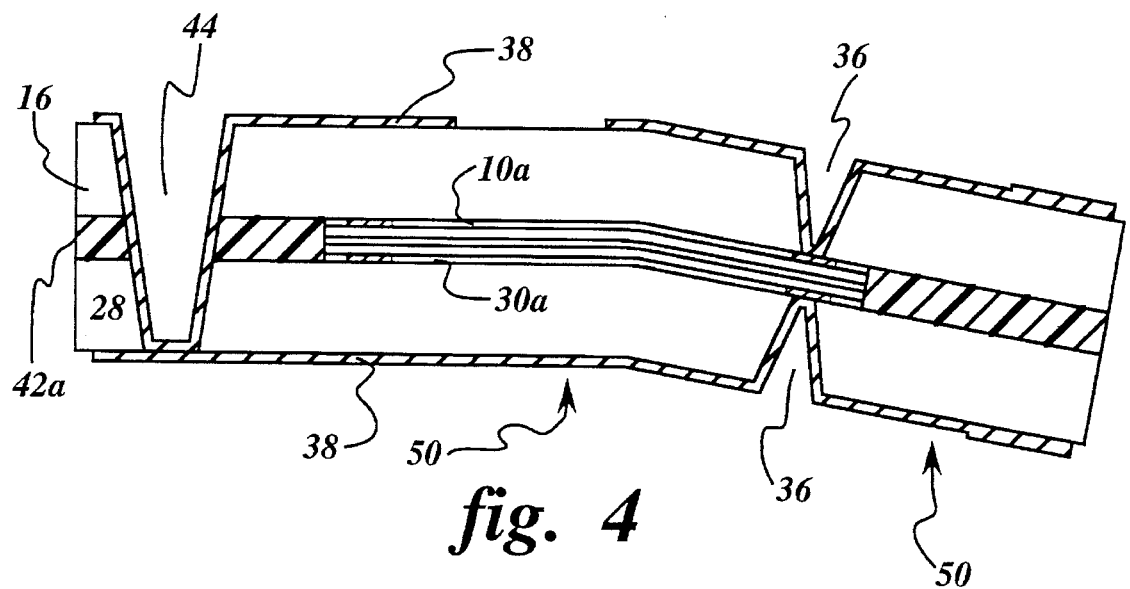
FIG. 4 is a view similar to that of FIG. 3 further showing a bend in the module.

FIG. 4 is a view similar to that of FIG. 3 further showing a bend 50 in the modules. If chips 10a and 30a comprising thin, flexible materials are used, the chips themselves can be bent for spatial reasons such as permitting a conformal fit to a curved surface.

Figure 5:
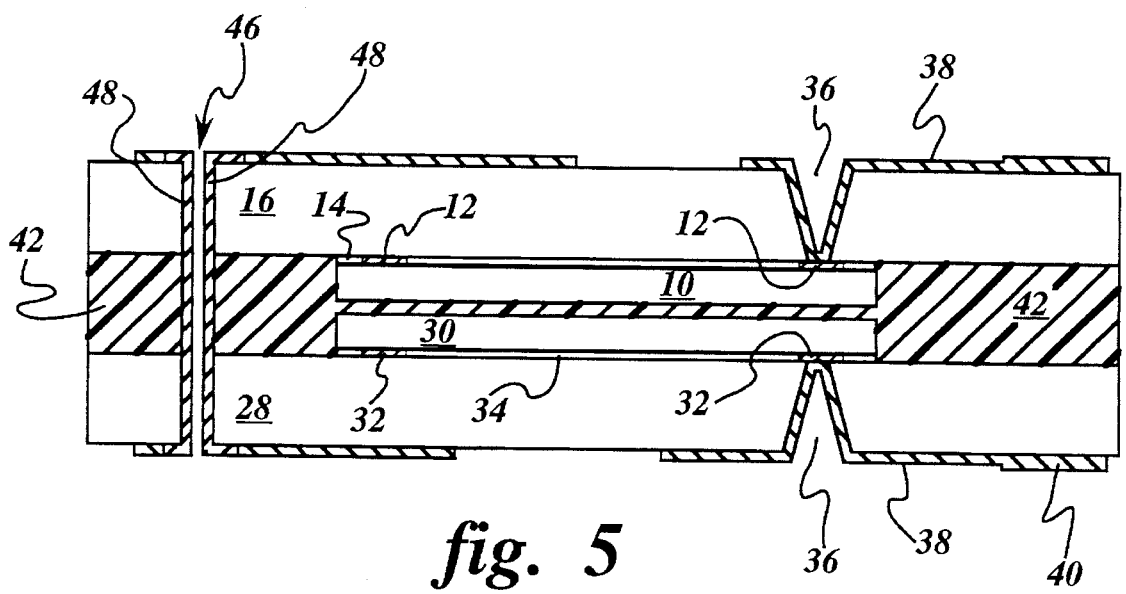
FIG. 5 is a view similar to that of FIG. 2 further showing a plated through hole for coupling the flexible interconnect layers.

FIG. 5 is a view similar to that of FIG. 2 further showing a through hole 46 covered by a metallization layer 48 for coupling the flexible interconnect layers. The metallized through hole can be fabricated before, after, or simultaneously as vias 36 and outer metallization layers 38 are formed.

In one embodiment, before outer metallization layers are formed, hole 46 is formed by mechanical or laser drilling. Vias 36 are formed either before or after hole 46. The module can then be dipped in a seed layer solution to create an electrically conductive seed layer which can further be thickened by processes such as electroless plating and electroplating as discussed above. If metallization of the outer metallization layers occurs simultaneously with metallization of holes 46 and if the chip pads are aluminum, a seed layer solution of palladium acetate is preferred. Otherwise, a palladium tin chloride solution is sufficient. The outer metallization layers can be etched using standard photoresist processes.

Alternatively, the metallization of hole 46 and of vias 36 can occur as two separate steps, if desired. Photoresist can be used to protect the earlier applied metallization during formation of the later applied metallization.

This embodiment can be used in a manner similar to a printed circuit board, especially if a hole is designed to have a height convenient for insertion of surface mount devices. The thermal qualities of this embodiment can be made superior to those of a printed circuit board by choosing appropriate materials for the molding material and the flexible interconnect layers.

Figure 6:
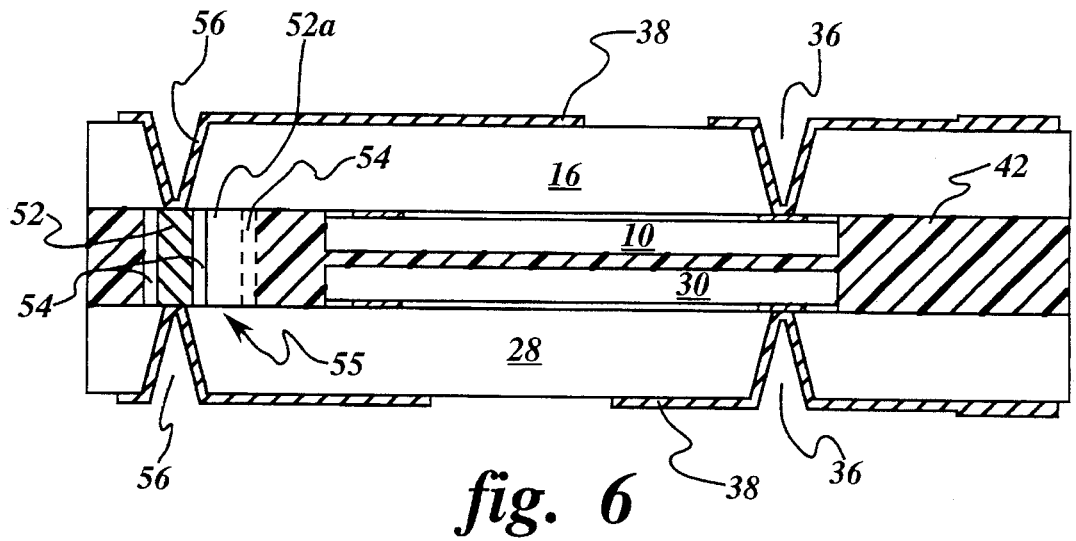
FIG. 6 is a view similar to that of FIG. 2 further showing a pin structure for coupling the flexible interconnect layers.

FIG. 6 is a view similar to that of FIG. 2 further showing a pin structure for coupling the flexible interconnect layers. In one embodiment, one or more pins 52 can be held in position with an adhesive (not shown) to flexible interconnect layer 28 at the same time that chips 30 are attached. As shown by pins 52 and 52a, the pins can be staggered. These pins may comprise an electrically conductive material such as copper, nickel coated copper, or Kovar coated by nickel and then gold, for example, which is capable of withstanding molding and outer metallization layer fabrication processes. Preferably the pins are wrapped in fixed arrays with a material 54 such as a polyimide, polysulfone, polyetherimide, or polytetrafluoroethylene, for ease of alignment in a module. If desired, the pins can function as spacers during the process of positioning the molding material 42. Moreover, pins 52 and material 54 can be designed to extend contiguously at the boundary of a module and thereby additionally serve as a molding form.

Figure 7:
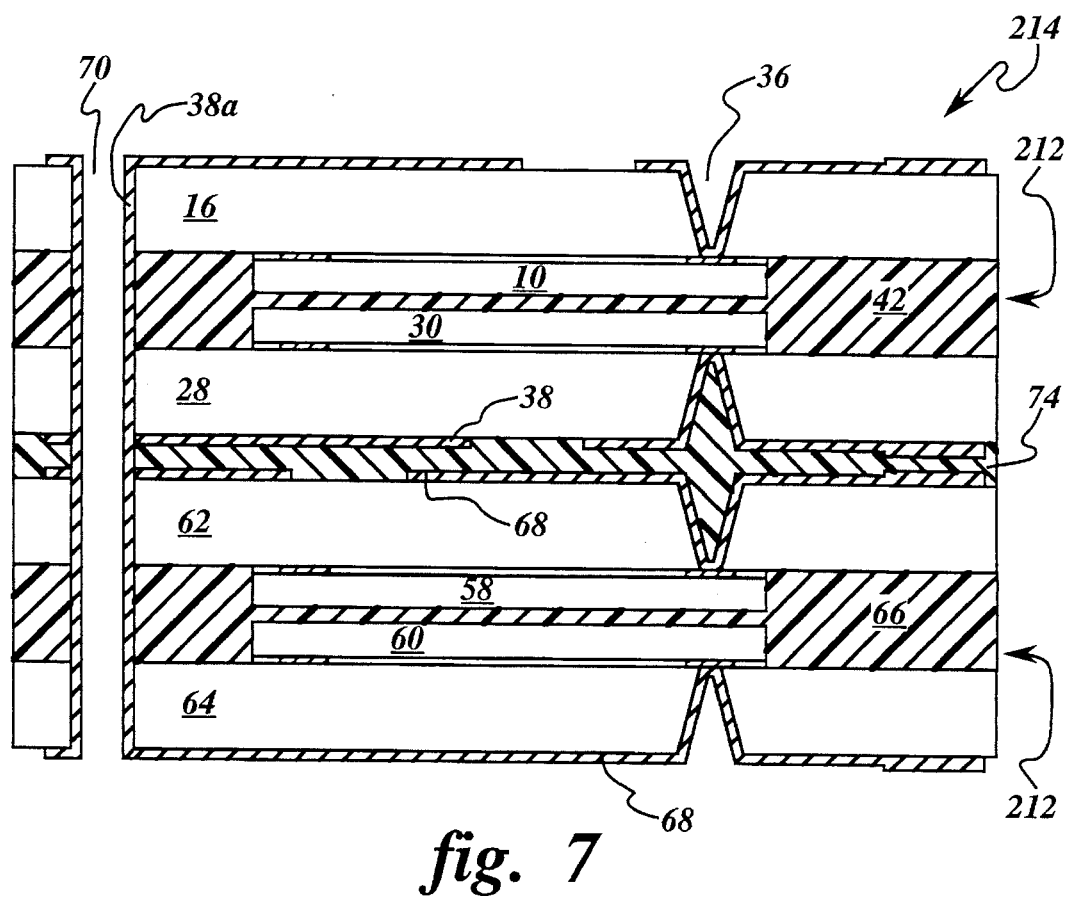
FIG. 7 is a view of a stack of two modules of the type shown in FIG. 2.

FIG. 7 is a view of a stack 214 of two modules 212 of the type shown in FIG. 2. The stack is useful for forming a three-dimensional mass memory structure. A second module can be fabricated with flexible interconnect layers 62 and 64, respective chips 58 and 60, and molding material 66 in the same manner as discussed with respect to the module shown in FIG. 2. Although FIG. 7 is shown as including two modules of the type shown in FIG. 2, the process is equally applicable to the modules shown in FIGS. 3–6. Furthermore, two modules are illustrated in the stack for example only; additional modules can be stacked.

The modules can be stacked in any appropriate manner. In one embodiment bonding material 74 comprising an adhesive material such as an epoxy, SPIE, for example, is inserted between adjacent modules. In another embodiment, if desired, the vacuum chamber shown in FIG. 2a and material similar to that of molding material 42 can be used.

Electrical interconnection of modules in a stack can be made using techniques similar to those discussed above for coupling structures within a module. In FIG. 7, a through hole 70 is shown as extending through the stack. If the hole extends through metallization, a mechanical drill is preferably used to form the hole. The hole can be metallized in the manner described with respect to FIG. 5. If the hole extends through intermediate layers of metallization 38, good contact can be made between through hole metallization 38a and metallization layers 38 by dipping and electroplating the stack as discussed with respect to FIG. 5.

Figure 8:
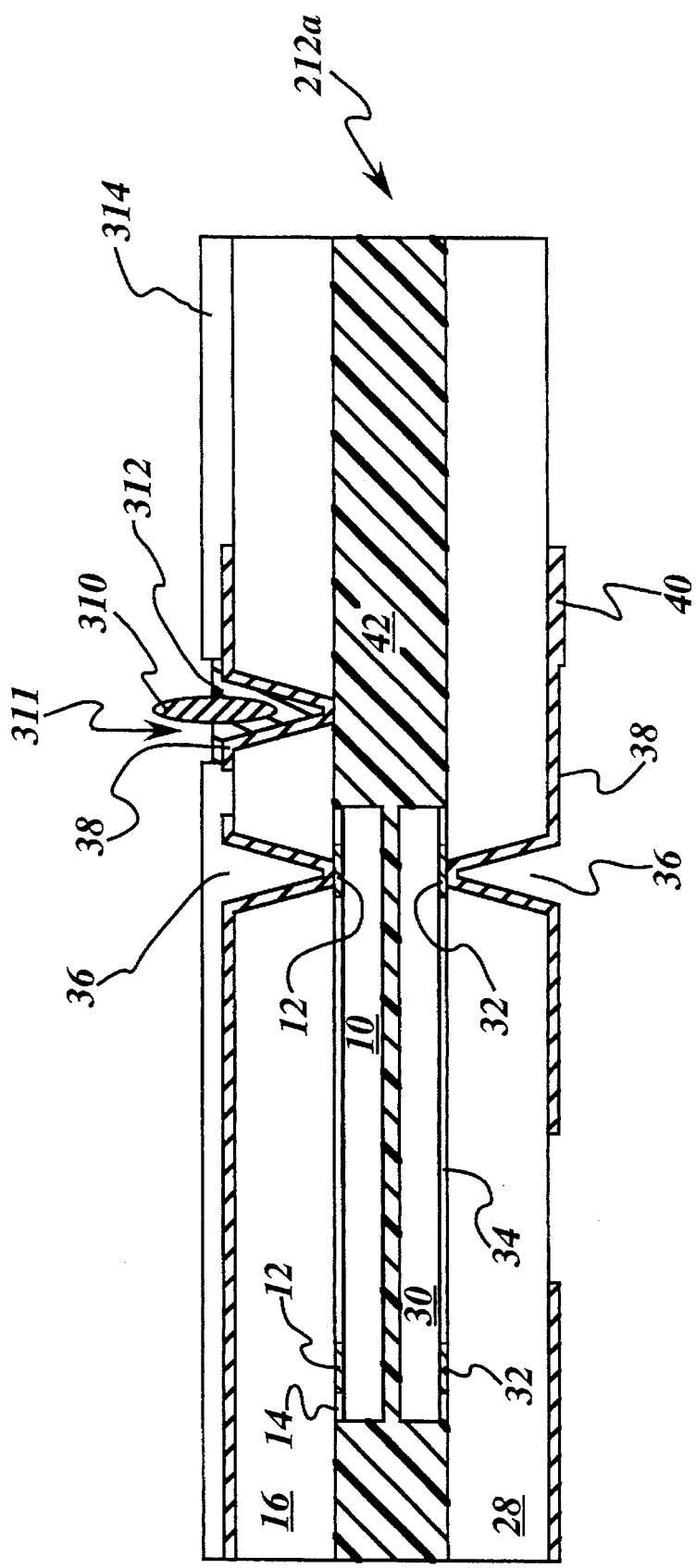
FIG. 8 is a view similar to that of FIG. 2 further showing an additional via and a conductive ball useful for electrical interconnection of stacked modules.

FIG. 8 is a view similar to that of FIG. 2 further showing an additional via 311 and a conductive ball 310 useful for electrical interconnection of stacked modules. In the embodiment of FIG. 8, module 212a can be fabricated in the same manner as discussed with respect to module 212 of FIG. 2. Although an extra via 311 (which can be fabricated in the same manner as via 36) is shown in FIG. 8, conductive ball 310 can be positioned in via 36 if desired.

Prior to the insertion of conductive ball 310, an adhesive layer 314 comprising a material such as an epoxy solder mask is applied and patterned, and a conductive material 312 such as silver epoxy is positioned in the via. The conductive ball can then be inserted in the via. Conductive ball 310 may comprise a metal ball or a metallized ball which is capable of forming a good contact with conductive material 312. For example, the metal or metallization of the conductive ball may comprise titanium, lead, or copper. Preferably the conductive ball extends upward from the via for ease of stacking.

Figure 9:
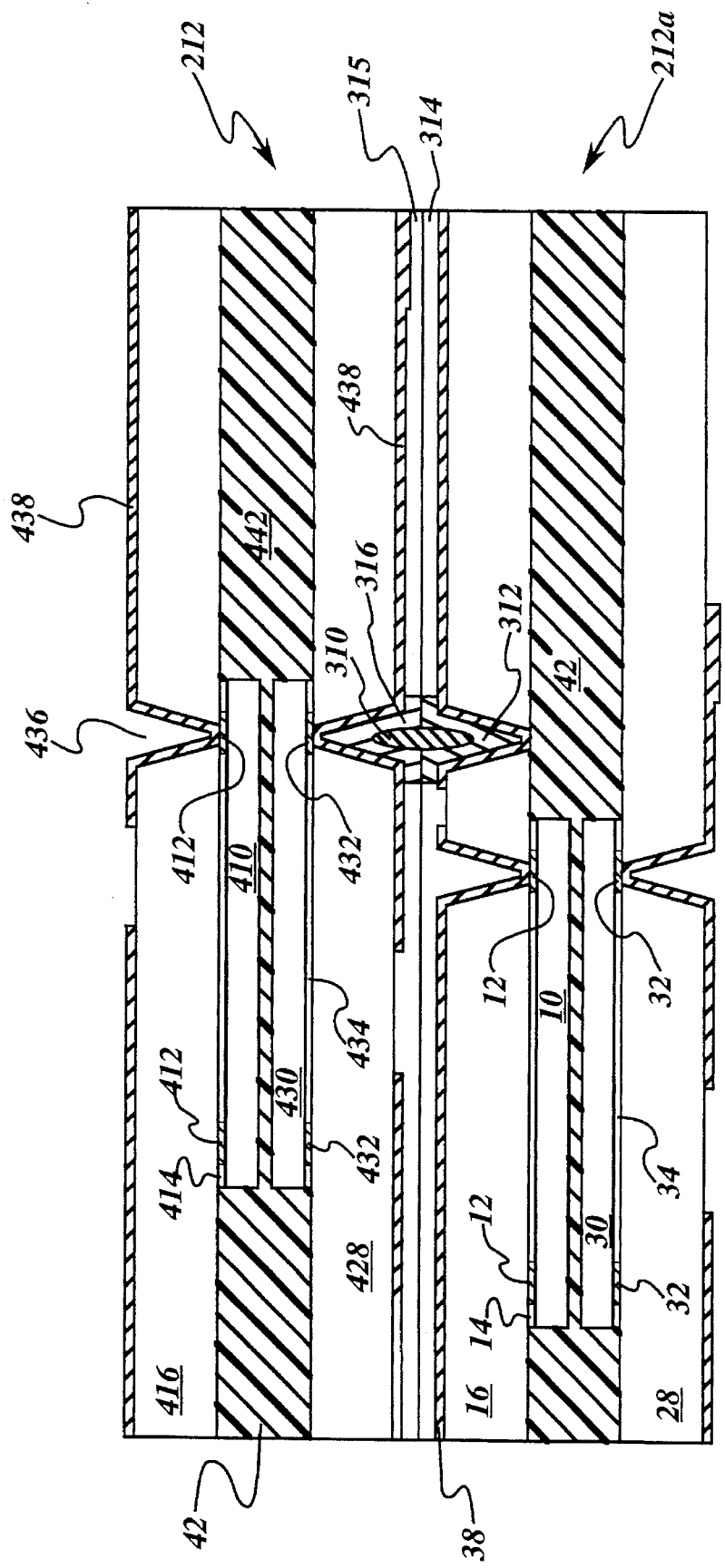
FIG. 9 is a view of a stack of two modules, one of the type shown in FIG. 8 and one of the type shown in FIG. 2.

FIG. 9 is a view of a stack of two modules, one 212a of the type shown in FIG. 8 and one 212 of the type shown in FIG. 2. An adhesive layer 315 and conductive material 316 can be applied to module 212. If the combination of adhesive layers 314 and 316 is sufficiently thick, an upper module can be positioned over the lower such that a selected via (including conductive material 316) of the upper module at least partially surrounds the upward extending portion of conductive ball 310. After conductive ball 310 is surrounded, adhesive layers 314 and 315 and conductive materials 312 and 316 can be hardened simultaneously.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method for fabricating a two-sided molded circuit module with flexible interconnect layers, the method comprising the steps of:
   providing first and second flexible interconnect structures, each flexible interconnect structure comprising a flexible interconnect layer having a chip surface and a chip with chip pads attached to the chip surface;
   providing molding material between the chip surfaces of the flexible interconnect layers and thereby surrounding respective chips with the molding material;
   solidifying the molding material;
   forming vias in the flexible interconnect layers, at least some of the vias extending to selected chip pads;
   applying a pattern of electrical conductors extending over the flexible interconnect layers and into the vias to couple selected ones of the chip pads.

2. The method of claim 1, wherein the step of forming vias further includes forming a via extending through one of the flexible interconnect structures and the molding material to the other of the flexible interconnect structures.

3. The method of claim 1, wherein each flexible interconnect layer comprises a plurality of polymer layers and at least one metallization layer.

4. The method of claim 1, wherein the molding material comprises an epoxy powder and the steps of providing and solidifying the molding material include applying heat under vacuum conditions.

5. The method of claim 1, further including forming a hole through the flexible interconnect structures and the molding material and coating the hole with an electrically conductive material.

6. The method of claim 1, further including positioning at least one electrically conductive pin between the first and second flexible interconnect structures and wherein the step of inserting molding material between the flexible interconnect layers for encapsulating the respective chips includes encapsulating the at least one pin and the step of forming vias extending to selected chip pads further includes forming a via to the at least one pin.

7. The method of claim 1, wherein the at least one chips are thin enough to withstand bending and further including the step of bending the module.

8. A method for fabricating a stack of two-sided molded circuit modules with flexible interconnect layers, the method comprising the steps of:
   for each molded circuit module,
      providing first and second flexible interconnect structures, each flexible interconnect structure comprising a flexible interconnect layer having a chip surface and a chip with chip pads attached to the chip surface,
      providing molding material between the chip surfaces of the flexible interconnect layers and thereby surrounding respective chips with the molding material,
      solidifying the molding material,
      forming vias in the flexible interconnect layers, at least some of the vias extending to selected chip pads,
      applying a pattern of electrical conductors extending over the flexible interconnect layers and into the vias to couple selected ones of the chip pads,
      applying an epoxy mask over the pattern of electrical conductors, the mask having an opening over at least one of the vias, and
      applying a soft conductive material in the at least one of the vias;
   inserting a portion of a conductive ball in the soft conductive material of one of the molded circuit modules;
   positioning the other of the molded circuit modules such that the soft conductive material of the other of the molded circuit modules at least partially surrounds a remaining portion of the conductive ball; and
   hardening the epoxy masks and the soft conductive materials.

* * * * *